United States Patent
Fan et al.

(10) Patent No.: US 7,927,919 B1
(45) Date of Patent: Apr. 19, 2011

(54) SEMICONDUCTOR PACKAGING METHOD TO SAVE INTERPOSER

(75) Inventors: Wen-Jeng Fan, Hsinchu (TW); Li-Chih Fang, Hsinchu (TW); Ronald Takao Iwata, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/630,623

(22) Filed: Dec. 3, 2009

(51) Int. Cl.
H01L 21/00 (2006.01)

(52) U.S. Cl. ........ 438/109; 438/106; 438/107; 438/108; 438/110; 257/686; 257/698; 257/723; 257/738; 257/724

(58) Field of Classification Search .......... 438/106–123, 438/455; 257/686, 698, 685, 723, 738, 724
See application file for complete search history.

(56) References Cited

U.S. PATENT DOCUMENTS

| | | | |
|---|---|---|---|
| 5,973,403 A * | 10/1999 | Wark | 257/777 |
| 6,300,158 B1 * | 10/2001 | Simburger et al. | 438/59 |
| 6,303,992 B1 * | 10/2001 | Van Pham et al. | 257/734 |
| 6,365,978 B1 * | 4/2002 | Ibnabdeljalil et al. | 257/786 |
| 6,483,098 B1 * | 11/2002 | Kato et al. | 250/214.1 |
| 6,498,053 B2 * | 12/2002 | Mastromatteo et al. | 438/107 |
| 6,528,408 B2 * | 3/2003 | Kinsman | 438/613 |
| 6,555,917 B1 * | 4/2003 | Heo | 257/777 |
| 6,853,058 B2 * | 2/2005 | Cobbley | 257/669 |
| 6,889,429 B2 * | 5/2005 | Celaya et al. | 29/840 |
| 7,005,321 B2 * | 2/2006 | Chee | 438/108 |
| 7,005,747 B2 * | 2/2006 | Koizumi | 257/777 |
| 7,015,570 B2 * | 3/2006 | Emma et al. | 257/685 |
| 7,067,352 B1 * | 6/2006 | Scheid | 438/109 |
| 7,183,652 B2 * | 2/2007 | Waidhas et al. | 257/772 |
| 7,218,005 B2 * | 5/2007 | Tago | 257/777 |
| 7,235,859 B2 * | 6/2007 | Brintzinger et al. | 257/529 |
| 7,239,020 B2 * | 7/2007 | Morkner | 257/777 |
| 7,242,082 B2 * | 7/2007 | Eide | 257/690 |
| 7,355,273 B2 * | 4/2008 | Jackson et al. | 257/686 |
| 7,413,929 B2 * | 8/2008 | Lee et al. | 438/110 |
| 7,462,930 B2 * | 12/2008 | Lee et al. | 257/686 |
| 7,742,313 B2 * | 6/2010 | Heng et al. | 361/784 |
| 7,768,115 B2 * | 8/2010 | Lee et al. | 257/686 |
| 2002/0076919 A1 * | 6/2002 | Peters et al. | 438/637 |
| 2002/0119600 A1 * | 8/2002 | Pierce | 438/118 |
| 2003/0057539 A1 * | 3/2003 | Koopmans | 257/686 |
| 2003/0089868 A1 * | 5/2003 | Ito et al. | 251/100 |
| 2003/0219969 A1 * | 11/2003 | Saito et al. | 438/622 |
| 2004/0012080 A1 * | 1/2004 | Hedler et al. | 257/678 |
| 2004/0032013 A1 * | 2/2004 | Cobbley et al. | 257/678 |
| 2004/0033673 A1 * | 2/2004 | Cobbley et al. | 438/455 |
| 2004/0124539 A1 * | 7/2004 | Yang et al. | 257/777 |
| 2004/0150979 A1 * | 8/2004 | Lambertini et al. | 362/31 |

(Continued)

*Primary Examiner* — N Drew Richards
*Assistant Examiner* — Ankush k Singal
(74) *Attorney, Agent, or Firm* — Muncy, Geissler, Olds & Lowe, PLLC (57) ABSTRACT

A semiconductor packaging method without an interposer is revealed. A mother chip is a two-layer structure consisting of a semiconductor layer and an organic layer where a redistribution layer is embedded into the organic layer with a plurality of first terminals and a plurality of second terminals disposed on the redistribution layer and exposed from the organic layer. The mother chip is flip-chip mounted on the substrate. The active surface of the daughter chip is in contact with the organic layer with the bonding pads of the daughter chip bonded to the first terminals. Furthermore, a plurality of electrically connecting components electrically connect the second terminals to the substrate. In the multi-chip stacked package, the interposer can be eliminated with a thinner overall package thickness as well as controlled package warpage.

15 Claims, 11 Drawing Sheets

U.S. PATENT DOCUMENTS

| | | | |
|---|---|---|---|
| 2004/0155328 A1* | 8/2004 | Kline | 257/700 |
| 2004/0159954 A1* | 8/2004 | Hetzel et al. | 257/777 |
| 2005/0082669 A1* | 4/2005 | Saijo et al. | 257/737 |
| 2005/0133935 A1* | 6/2005 | Vasishta et al. | 257/782 |
| 2005/0156304 A1* | 7/2005 | Furuyama et al. | 257/686 |
| 2005/0218509 A1* | 10/2005 | Kipnis et al. | 257/723 |
| 2005/0221598 A1* | 10/2005 | Lu et al. | 438/613 |
| 2005/0231626 A1* | 10/2005 | Tuttle et al. | 348/340 |
| 2005/0258506 A1* | 11/2005 | Brintzinger et al. | 257/529 |
| 2006/0005384 A1* | 1/2006 | Hung et al. | 29/832 |
| 2006/0170098 A1* | 8/2006 | Hsu | 257/723 |
| 2006/0223226 A1* | 10/2006 | Guzek et al. | 438/106 |
| 2006/0237713 A1* | 10/2006 | Lee et al. | 257/40 |
| 2007/0069389 A1* | 3/2007 | Wollanke et al. | 257/777 |
| 2007/0114647 A1* | 5/2007 | Hsu | 257/679 |
| 2007/0284723 A1* | 12/2007 | Kim | 257/692 |
| 2008/0036083 A1* | 2/2008 | Sawada et al. | 257/737 |
| 2008/0096310 A1* | 4/2008 | Modi et al. | 438/106 |
| 2008/0160671 A1* | 7/2008 | Liang et al. | 438/107 |
| 2008/0315415 A1* | 12/2008 | Ino | 257/737 |
| 2009/0001549 A1* | 1/2009 | Park et al. | 257/693 |
| 2009/0021974 A1* | 1/2009 | Nonomura et al. | 365/63 |
| 2009/0079065 A1* | 3/2009 | Furgut et al. | 257/724 |
| 2009/0258459 A1* | 10/2009 | Gerber et al. | 438/107 |
| 2010/0013101 A1* | 1/2010 | Hedler et al. | 257/773 |
| 2010/0117242 A1* | 5/2010 | Miller et al. | 257/777 |

* cited by examiner

SEMICONDUCTOR PACKAGING METHOD TO SAVE INTERPOSER

FIELD OF THE INVENTION

The present invention relates to a packaging technology of semiconductor devices, and more particularly to a semiconductor packaging method without an interposer between the stacked chips.

BACKGROUND OF THE INVENTION

Multi-chip stacked packages have become the major technology for miniature of electronic devices to achieve system integration with large capacity. Since multiple chips are assembled in a single package, the footprint and volume of the single package is much smaller than the total of the footprints and volumes of packages which are individually assembled. Multi-chip stacked packages have the advantages of higher efficiency and multiple functions to meet the miniature requirements.

In the existing semiconductor industries, an interposer is needed to assemble a multi-chip stacked package with chips of different dimensions to complete electrical connections between a daughter chip and a mother chip where the interposer has the redistribution function to overcome different electrical connections between stacked chips with different dimensions, to avoid long bonding wire issues, and to make the impossible electrical connections become possible. Generally speaking, the interposer can be chosen from dummy chip, ceramic substrate, or organic substrate, however, reliability issues and uncontrollable package warpage after multi-chip stacking become major concerns where the reliability issue is caused by delamination due to CTE mismatch and due to poor adhesion between adjacent layers in a conventional stacked package.

Figure 1:
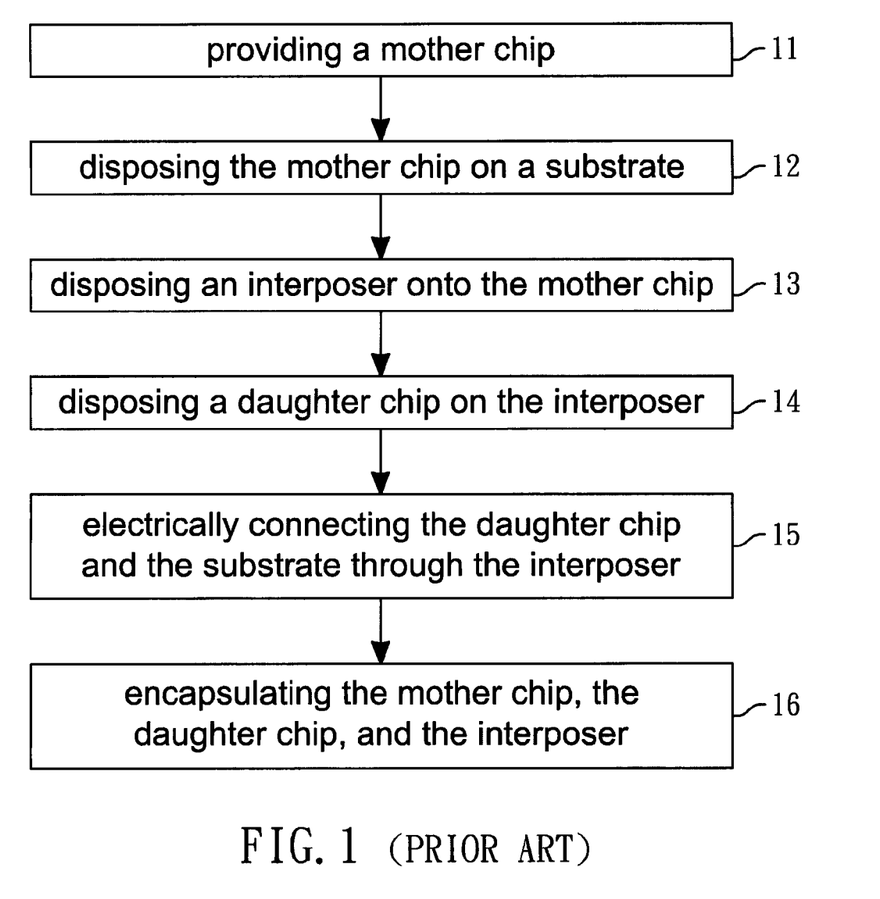
FIG. 1 is a process flow block diagram of a conventional semiconductor method with an interposer.
Figure 2:
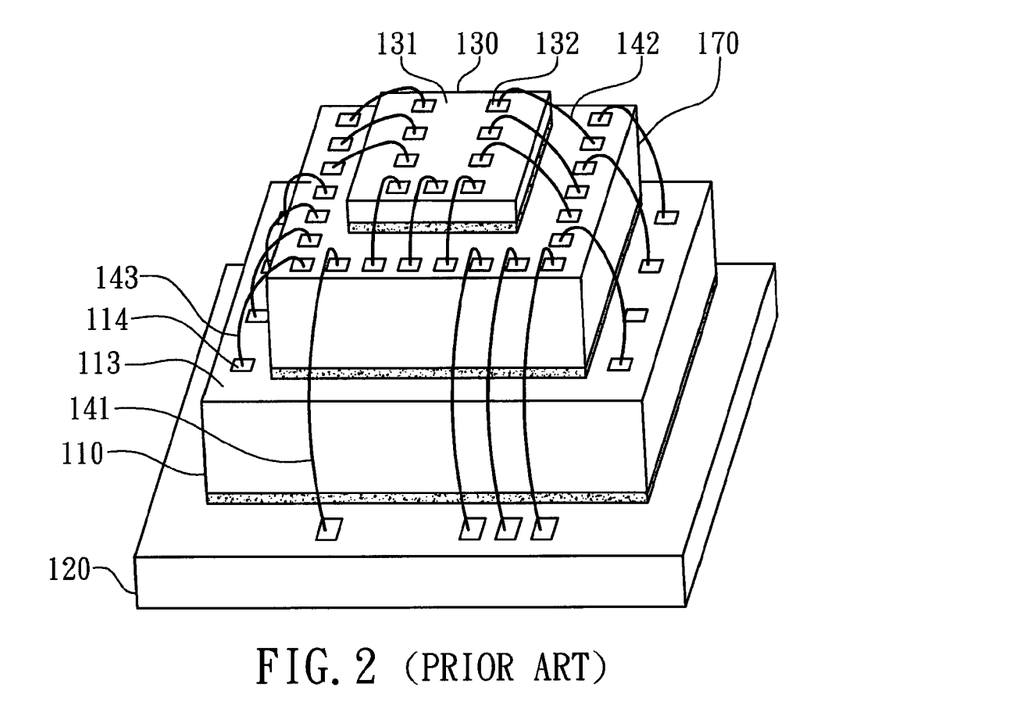
FIG. 2 is a three-dimensional view of a multi-chip stacked package through the encapsulant fabricated according to the process flow of the conventional method of FIG. 1.
Figure 3:
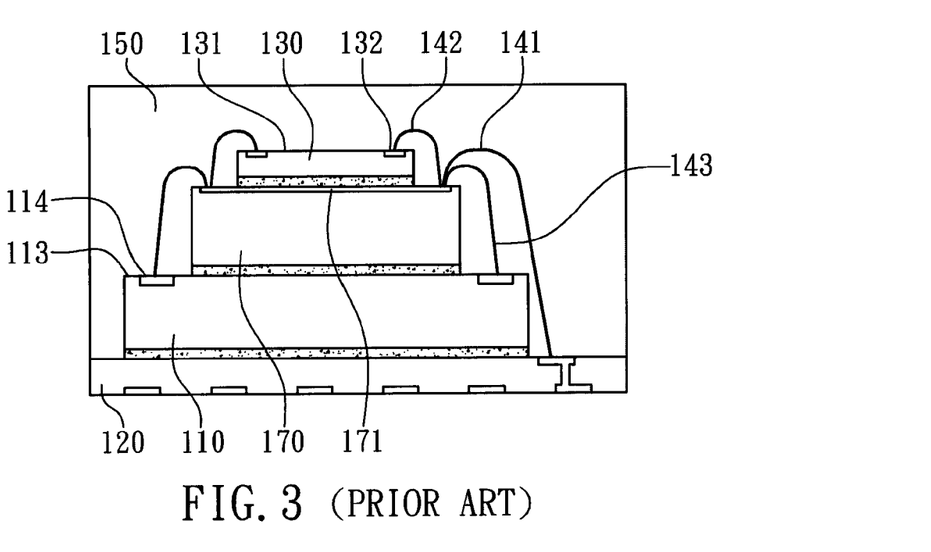
FIG. 3 is a cross-sectional view of the multi-chip stacked package of FIG. 2.

As shown in FIG. 1, a conventional semiconductor packaging method using an interposer is disclosed. The process includes the following steps, "providing a mother chip" as step 11, "disposing the mother chip on a substrate" as step 12, "disposing an interposer onto the mother chip" as step 13, "disposing a daughter chip on the interposer" as step 14, "electrically connecting the daughter chip and the substrate through the interposer" as step 15, and "encapsulating the mother chip, the daughter chip, and the interposer" as step 16. A conventional semiconductor package using an interposer are shown in FIG. 2 and FIG. 3, primarily comprising a mother chip 110, a substrate 120, a daughter chip 130 which is smaller than the mother chip 110, and an interposer 170 disposed between the mother chip 110 and the daughter chip 130. The mother chip 110 is a large-sized chip for carrying the interposer 170 and the daughter chip 130. The semiconductor package is fabricated according to FIG. 1. In step 11, the mother chip 110 is provided where a plurality of electrodes 114 such as bonding pads are disposed on the active surface 113 of the mother chip 110. In step 12, the mother chip 110 is disposed on the substrate 120 by the existing die-attaching technology. In step 13, the interposer 170 is disposed on the active surface 113 of the mother chip 110 without covering the electrodes 114 where the interposer 170 has a redistribution layer 171 as shown in FIG. 3. In step 14, the back surface of the daughter chip 130 with a smaller dimension is attached to the interposer 170 where the daughter chip 130 has a plurality of bonding pads 132 on its active surface 131. Therefore, in this multi-chip stacked package with chips of different dimensions, the overall package thickness is increased by adding the interposer 170 with two die-attaching layers disposed on the top and bottom surfaces of the interposer 170. Moreover, in step 15, the interposer 170 is electrically connected to the substrate 120 by a plurality of electrically connecting components such as first bonding wires 141. The daughter chip 130 is electrically connected to the interposer 170 by a plurality of second bonding wires 142 connecting the bonding pads 132 and the redistribution layer 171. The interposer 170 is further electrically connected with the mother chip 110 by a plurality of third bonding wires 143 connecting the bonding pads 114 and the redistribution layer 171. Furthermore, in step 16, an encapsulant 150 is formed on the substrate 120, as shown in FIG. 3, to encapsulate the mother chip 110, the daughter chip 130, and the interposer 170. Since an interposer is a required component in the conventional multi-chip stacked package with chips of different dimensions so that the overall package thickness is increased and issues of delamination and warpage due to CTE mismatch and poor adhesion between adjacent layers are encountered.

SUMMARY OF THE INVENTION

The main purpose of the present invention is to provide a semiconductor packaging method without an interposer primarily for stacking multi-chip packages with chips of different dimensions to eliminate interposers without impacting the electrical performance and to further reduce the overall package thickness and to prevent delamination and package warpage.

The second purpose of the present invention is to provide a semiconductor packaging method without an interposer to achieve the active surfaces of multiple chips facing toward the substrate without disposing bumps between chips to effectively reduce the overall package thickness.

According to the present invention, a semiconductor packaging method without an interposer is revealed. Firstly, a mother chip is provided, where the mother chip is a two-layer structure consisting of a semiconductor layer and an organic layer, a plurality of electrodes are disposed on a first active surface of the semiconductor layer, and a redistribution layer is embedded in the organic layer with a plurality of first terminals and a plurality of second terminals disposed on the redistribution layer and exposed from the organic layer. Then, the mother chip is mounted on the substrate so that a plurality of electrodes of the mother chip are electrically connected to the substrate. In the next step, a daughter chip is attached onto the mother chip, where a second active surface of the daughter chip is in contact with the organic layer with a plurality of bonding pads of the daughter chip bonded to the first terminals. Then, a plurality of electrically connecting components are disposed to electrically connect the second terminals to the substrate.

The semiconductor packaging method without an interposer according to the present invention has the following advantages and functions:

1. Through providing a two-layer mother chip as a technical mean, the mother chip consists of a semiconductor layer and an organic layer to embed a redistribution layer to replace the conventional interposer with two die-attaching layers implementing in multi-chip stacked packages with chips of different dimensions to eliminate an interposer without impacting the electrical performance and to further reduce the overall package thickness. Furthermore, the warpage issues due to CTE mismatch between the interposer and the chips and the delamination issues due to poor adhesion between adjacent layers of conventional multi-chip stacked packages can be well controlled.

2. Through providing a two-layer mother chip as a technical mean, the daughter chip with a smaller dimension can be a bare chip to fully attach the active surface of the daughter chip to the organic layer of the mother chip to achieve the active surfaces of multiple chips facing toward the substrate without disposing bumps between the chips to effectively reduce the overall package thickness.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 4:
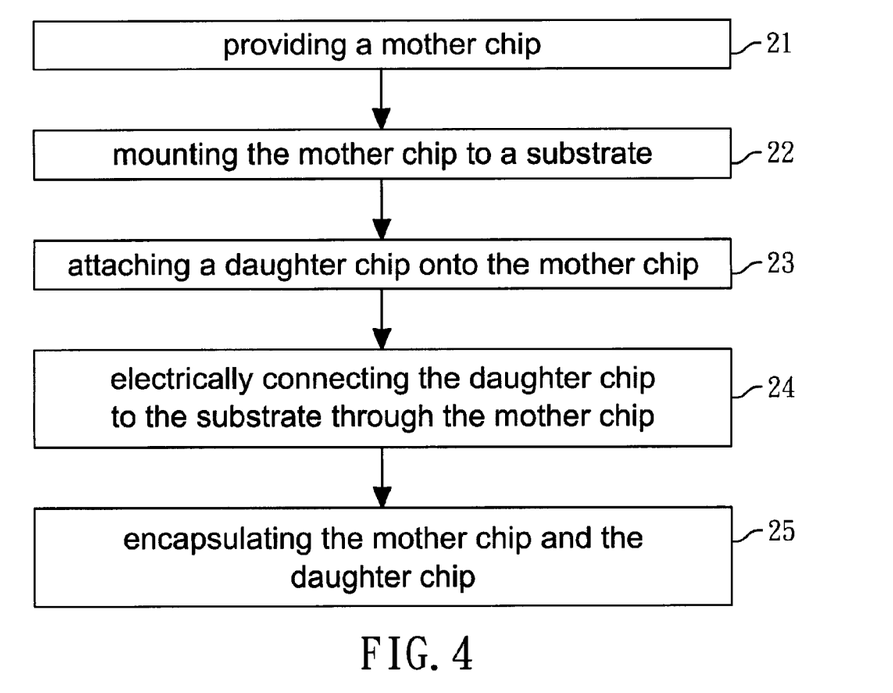
FIG. 4 is a process flow block diagram of a semiconductor packaging method without an interposer according to the preferred embodiment of the present invention.
Figure 5:
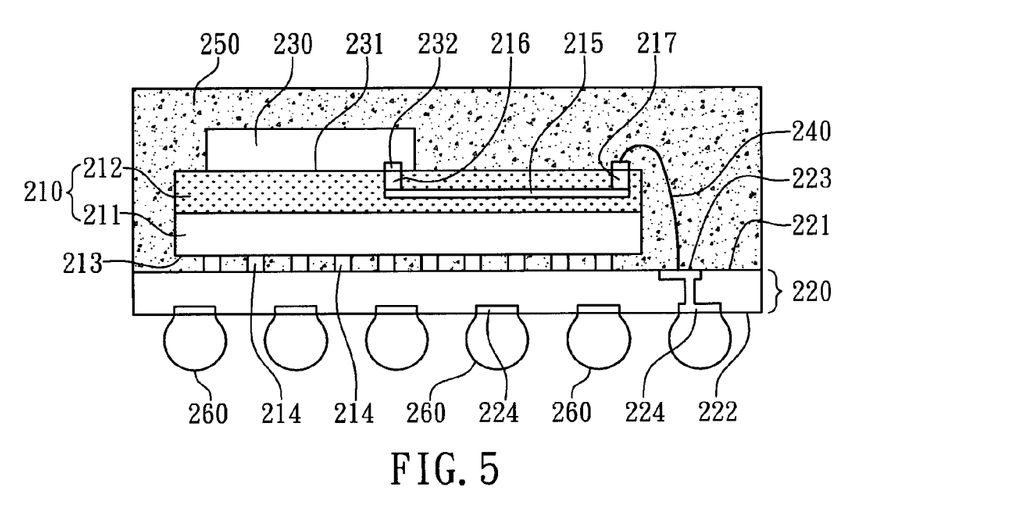
FIG. 5 is a cross-sectional view of a semiconductor package based on the process flow block diagram revealed in FIG. 4.

According to the preferred embodiment of the present invention, a semiconductor packaging method without an interposer is illustrated in FIG. 4 for a process flow block diagram, a semiconductor package fabricated according to the semiconductor packaging method is illustrated in FIG. 5 for a cross-sectional view. As shown in FIG. 5, the semiconductor package primarily comprises a mother chip 210, a substrate 220, a daughter chip 230, and a plurality of electrically connecting components 240.

The primary process steps of the semiconductor packaging method are illustrated from FIG. 6A to FIG. 6E. As shown in FIG. 4, the semiconductor packaging method without an interposer primarily comprises the following steps: "providing a mother chip" as step 21, "mounting the mother chip to a substrate" as step 22, "attaching a daughter chip onto the mother chip" as step 23, "electrically connecting the daughter chip to the substrate through the mother chip" as step 24, and "encapsulating the mother chip and the daughter chip" as step 25, where each process step is clearly illustrated from FIG. 6A to FIG. 6E as follows.

Figure 6A:
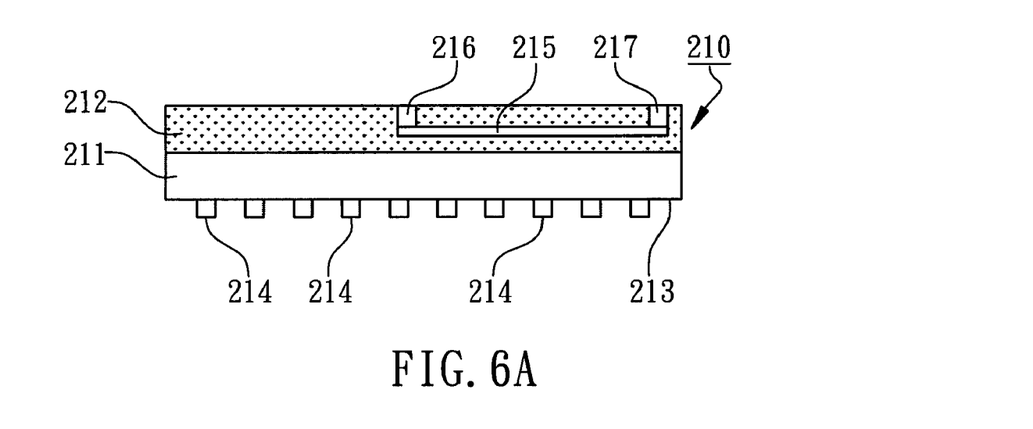
FIGS. 6A to 6E are the cross-sectional views of components of the semiconductor package in fabricating steps to illustrate the process flow block diagram revealed in FIG. 4 according to the preferred embodiment of the present invention.

Firstly, components in step 21 are shown in FIG. 6A. The mother chip 210 is a two-layer structure consisting of a semiconductor layer 211 and an organic layer 212. The semiconductor layer 211 and the organic layer 212 compose a complete chip for die-attaching processes, i.e., the organic layer 212 is formed on the wafer level but not formed on individual chips after wafer-sawing the semiconductor layer. The materials of the semiconductor layer 211 can be Si (silicon) or III-V semiconductors where the material of the organic layer 212 contains Carbon such as polyimide. ICs, not shown in the figure, are disposed on one surface of the semiconductor layer 211 where the ICs are memory components in the present embodiment and the surface is a first active surface 213. A plurality of electrodes 214 are disposed on the first active surface 213 of the semiconductor layer 211 as external terminals of the ICs. In the present embodiment, the electrodes 214 are bumps such as solder balls or metal pillars so that the mother chip 210 can be flip-chip mounted onto the substrate 220 as shown in FIG. 5. In the present embodiment, the semiconductor layer 210 can come from a thinned wafer after lapping without normal chip thickness where the thickness can be controlled between 2 mils to 8 mils or thinner. The thickness of the organic layer 212 can be smaller than half of the thickness of the semiconductor layer 211, such as 10 μm (micrometer).

In the mother chip 210, a redistribution layer 215 is embedded in the organic layer 212 with a plurality of first terminals 216 and a plurality of second terminals 217 disposed on the redistribution layer 215 and exposed from the organic layer 212. The redistribution layer 215 is electrically conductive such as copper traces to shorten the lengths of the electrically connecting components 240. In a more specific structure, the redistribution layer 212 is electrically isolated from the semiconductor layer 211 to be the redistribution layer only for the daughter chip 230 as shown in FIG. 5. Therefore, the organic layer 212 possesses the function of interposer in the mother chip 210 to eliminate the disposition of an interposer in the packaging processes. The first terminals 216 and the second terminals 217 are also conductive materials such as copper pillars or Ni/Au pillars as the external terminals for the redistribution layer 215 where the first terminals 216 and the second terminals 217 can further control the embedded depth of the redistribution layer 215. To be more specific, the organic layer 212 can be a die attach film (DAM) with adhesion which can be thermoplastic adhesive or B-stage adhesive during packaging processes to embed the redistribution layer 215 inside the organic layer 212 so that an adhesion layer and a solder mask to cover the redistribution layer 215 can be further eliminated.

Figure 6B:
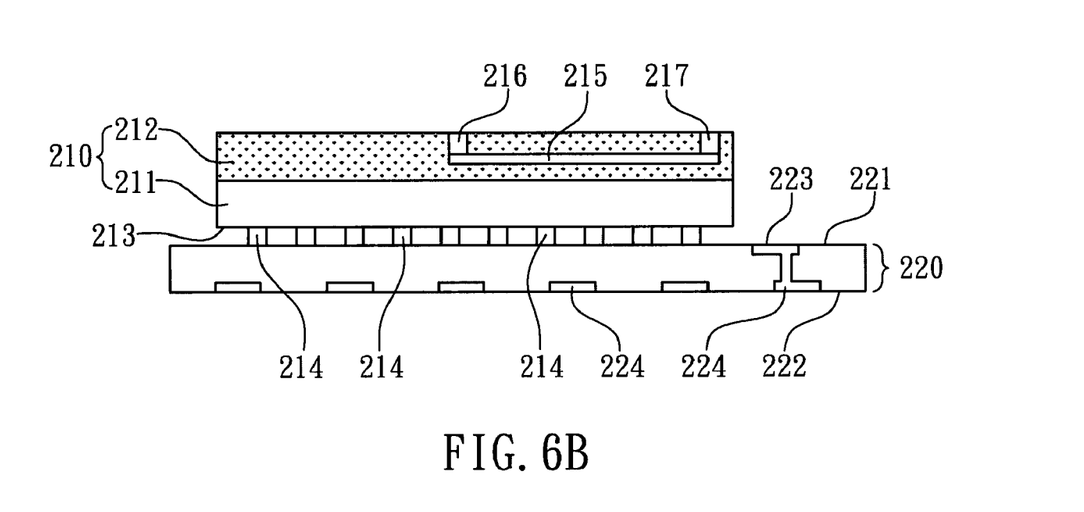

Then step 22 is followed. As shown in FIG. 6B, the mother chip 210 is mounted on the top surface 221 of the substrate 220 so that the electrodes 214 of the mother chip 210 are electrically connected to the substrate 220. In the present embodiment, the mother chip 210 is a bumped chip, i.e., the electrodes are bumps, and is flip-chip bonded to the substrate 220. Normally, after the mounting step 22, a mounting gap is formed between the mother chip 210 and the substrate 220, and their mechanical and electrical connections are established. In this step, the first active surface 213 of the mother chip 210 is faced toward the substrate 220. Preferably, the electrodes 214 are metal pillars extruded from the first active surface 213 so that the encapsulant 250 can fill into the mounting gap between the mother chip 210 and the substrate 220, as shown in FIG. 5. In this embodiment, the substrate 220 is a printed wiring board (PWB) and has a plurality of bonding finger 223 disposed on the top surface 221 outside the footprint of the mother chip 210. Furthermore, the substrate 220 further has a plurality of external pads 224 on its bottom surface 222 where the external pads 224 are electrically connected to the fingers 223 and internal pads bonded by the electrodes 214 through the internal circuitry of the substrate 220.

Figure 6C:
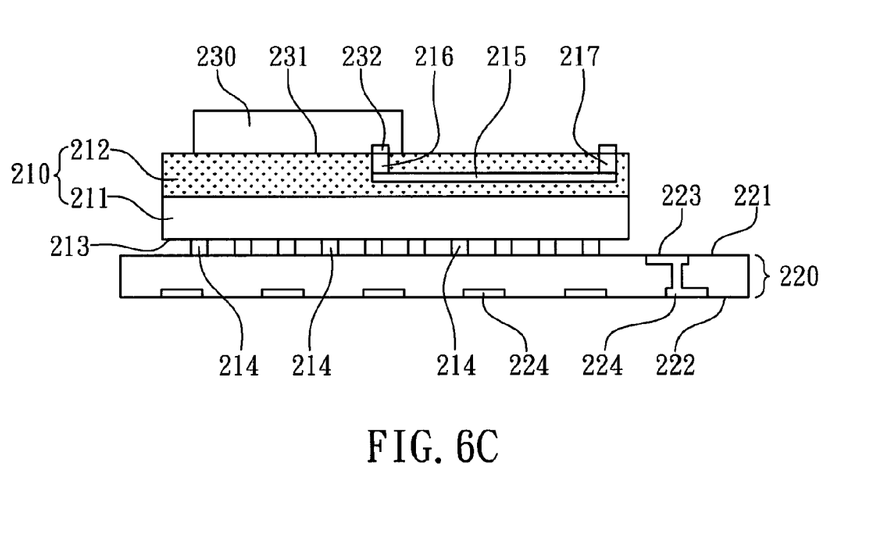

Then step 23 is executed. As shown in FIG. 6C, the daughter chip 230 is attached onto the mother chip 210 where the second active surface 231 of the daughter chip 230 is in contact with the organic layer 212 with a plurality of bonding pads 232 of the daughter chip 230 bonded to the first terminals 216. After the attaching step 23, there is no mounting gap formed between the daughter chip 230 and the mother chip 210. In the present embodiment, the daughter chip 230 is a controller with a dimension much smaller than the dimension of the mother chip 210, such as a memory chip. Moreover, the daughter chip 230 can be attached to the mother chip 210 using the conventional die-attach processes to achieve flip-chip bonding purposes through the specific structure of the mother chip 210. Preferably, the daughter chip 230 is a bare chip where the second active surface 231 is completely attached to the organic layer 212 so that there is no thickness reserved for either bumps nor die-attach materials between the daughter chip 230 and the mother chip 210 to achieve thinner overall package thickness for stacking multiple chips with different chip dimension. Therefore, the active surfaces of the multiple chips 210 and 230 can face toward the substrate 220 without interposer to effectively reduce the overall package thickness.

Figure 6D:
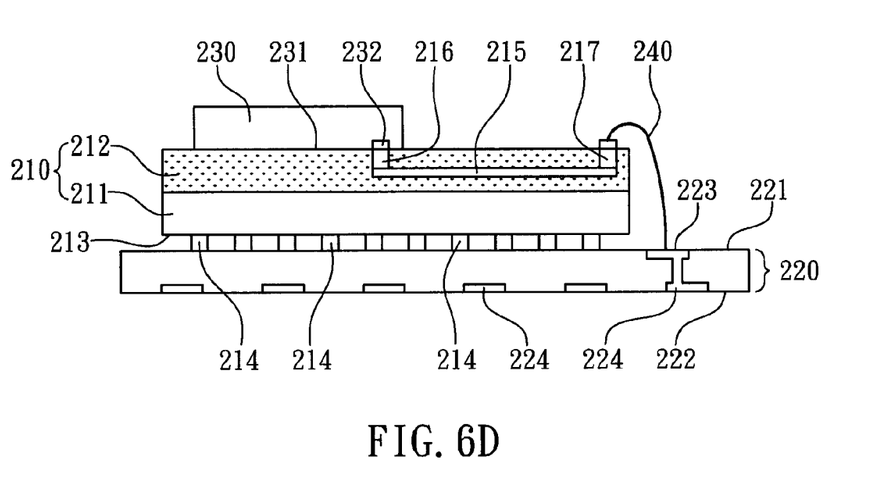

Then step 24 is performed. As shown in FIG. 6D, a plurality of electrically connecting components 240 are disposed to electrically connect the second terminals 217 to the fingers 223 of the substrate 220. Preferably, the organic layer 212 is fully cured by a post curing step before step 24. The electrically connecting components 240 can be formed by the existing wire-bonding technology or by inner lead bonding (ILB) technology. Preferably, the electrically connecting components 240 can include a plurality of bonding wires having a loop height not higher than the back surface of the daughter chip 230.

Figure 6E:
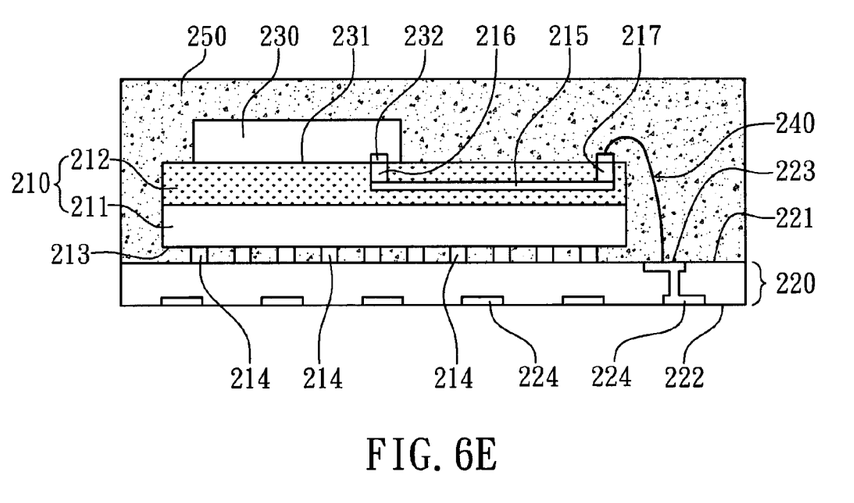

The semiconductor packaging method may further comprises the encapsulation step 25. As shown in FIG. 6E, an encapsulant 250 is formed on the substrate 220 by molding technology to encapsulate the mother chip 210, the daughter chip 230, and the electrically connecting components 240. Furthermore, as shown in FIG. 5 again, the semiconductor packaging method may further comprises the step of disposing a plurality of external terminals 260 on the bottom surface 222 of the substrate 220. In this embodiment, the external terminals 260 can be solder balls bonded on the external pads 224.

Accordingly, a semiconductor package without an interposer is fabricated according to the semiconductor packaging method mentioned above. As shown in FIG. 5 again, the semiconductor package comprises the previous described components such as the mother chip 210, the substrate 220, the daughter chip 230, and the electrically connecting components 240 where the mother chip 210 is mounted on the substrate 220 so that the electrodes 214 of the mother chip 210 are electrically connected to the substrate 220. The daughter chip 230 is attached onto the mother chip 210 where the second active surface 231 of the daughter chip 230 is in contact with the organic layer 212 with the bonding pads 232 of the daughter chip 230 bonded to the first terminals 216. The electrically connecting components 240 electrically connect the second terminals 217 to the substrate 220.

Therefore, the semiconductor packaging method according to the present invention can eliminate conventional interposer in the multi-chip stacked packages with chips of different dimensions. Since the mother chip 210 composes a semiconductor layer 211 and an organic layer 212 where the organic layer 212 with the embedded redistribution layer 215 can replace the conventional interposer with two die-attaching layers in multi-chip stacked packages with chips of different dimensions to eliminate an interposer without impacting the electrical performance to further reduce overall package thickness. Furthermore, the warpage issues due to CTE mismatch between a conventional interposer and the chips and the delamination issues due to poor adhesion between adjacent layers of multi-chip stacked packages can be well controlled.

Figure 7A:
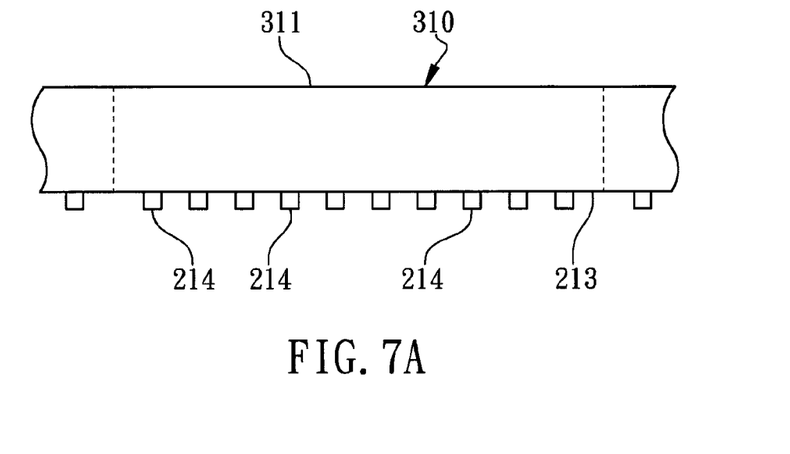
FIGS. 7A to 7E are the cross-sectional views of components of the semiconductor package in the fabricating step of "providing a mother chip" to illustrate its sub-steps according to the preferred embodiment of the present invention.
Figure 7B:
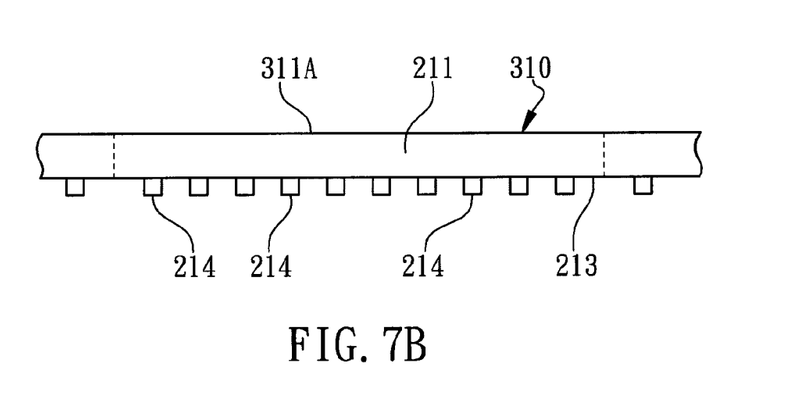
Figure 7C:
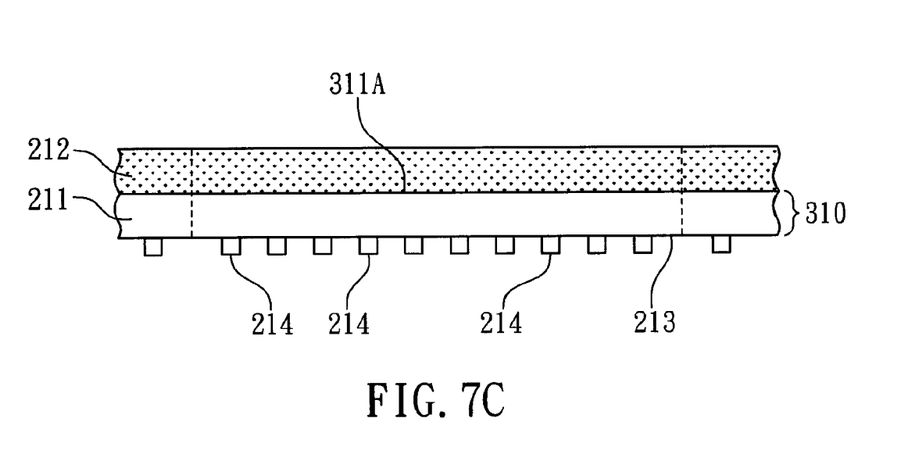
Figure 7D:
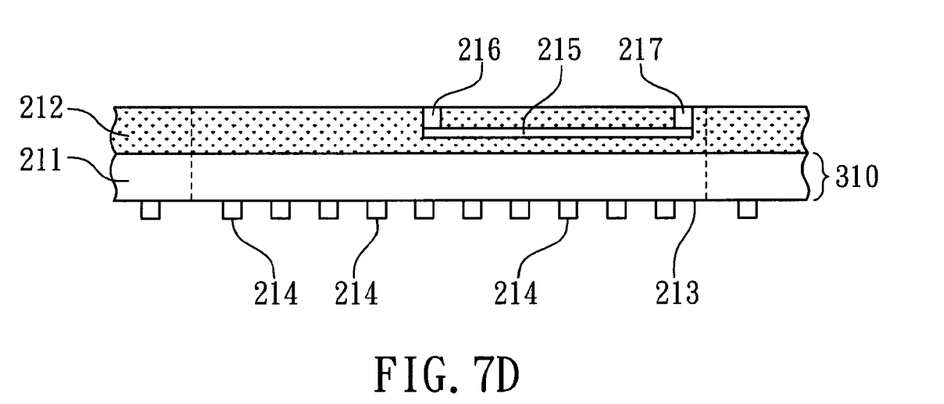
Figure 7E:
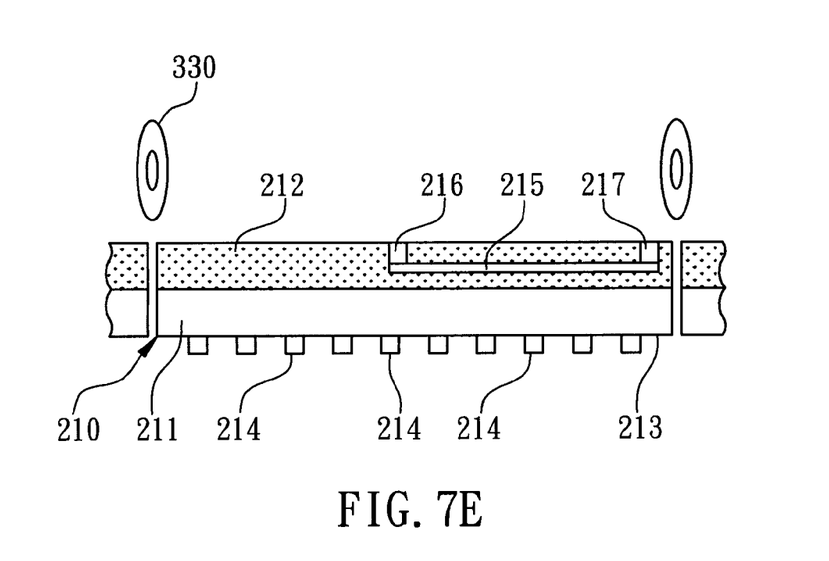

As shown from FIG. 7A to FIG. 7E, the fabrication of the mother chip 210 is further illustrated. The previous described step 21 of "providing a mother chip" further comprises the following steps. Firstly, as shown in FIG. 7A, a wafer 310 is provided, where the wafer 310 has a thickness about 10 mils or thicker that is thick enough to fabricate ICs on the first active surface 213 with the electrodes 214. Then, as shown in FIG. 7B, the step of lapping the wafer 310 is performed, where the back surface 311 of the wafer 310 is lapped to achieve the required thickness of the semiconductor layer 211 and a lapped back surface 311A is formed after lapping. Then, as shown in FIG. 7C, the performed step is to form an organic layer 212 over the lapped back surface 311A of the wafer 310, where the organic layer 212 is formed by lamination or by printing. Then, as shown in FIG. 7D, the step of forming the redistribution layer 215 is performed, where the redistribution layer 215 is embedded into the organic layer 212 which will be described in detail in the following context. As shown in FIG. 7E, the next step is singulating the wafer 310, where the wafer 310 is sawed through the organic layer 212 along the scribe lines by a sawing blade 330 to form individual mother chips 210. Furthermore, the disposition of the extruded electrodes 214 can be performed before the wafer lapping processes. Alternatively, the disposition of the extruded electrodes 214 is performed after embedding the redistribution layer 215 and before sawing the lapped wafer 310. Therefore, the organic layer 212 is formed by wafer level to become parts of the internal structures of the mother chip 210 but is not formed by attaching to the back surfaces of the individual chips after wafer sawing.

Figure 8A:
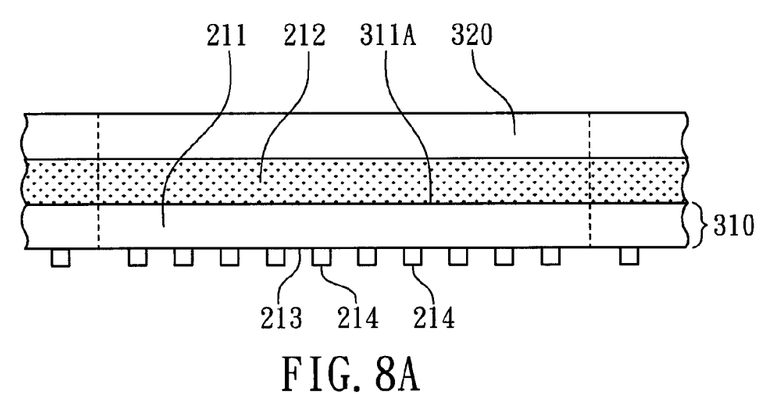
FIGS. 8A to 8D are the cross-sectional views of components of the semiconductor package in the fabricating sub-step of "forming a redistribution layer" in the step of "providing a mother chip" to illustrate its sub-steps according to a preferred embodiment of the present invention.
Figure 8B:
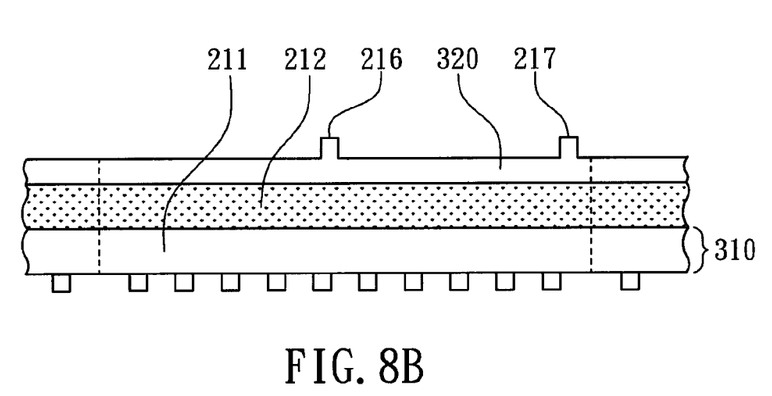
Figure 8C:
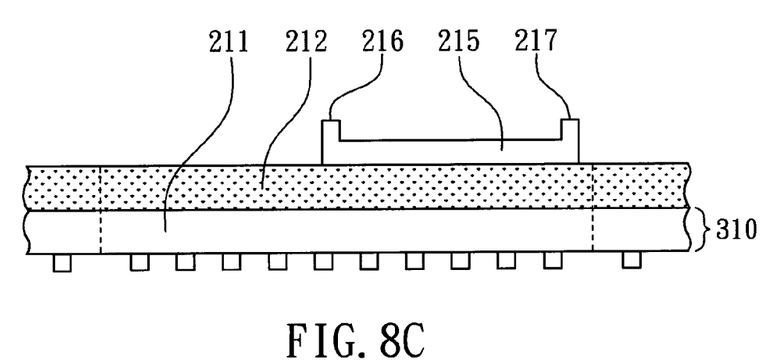
Figure 8D:
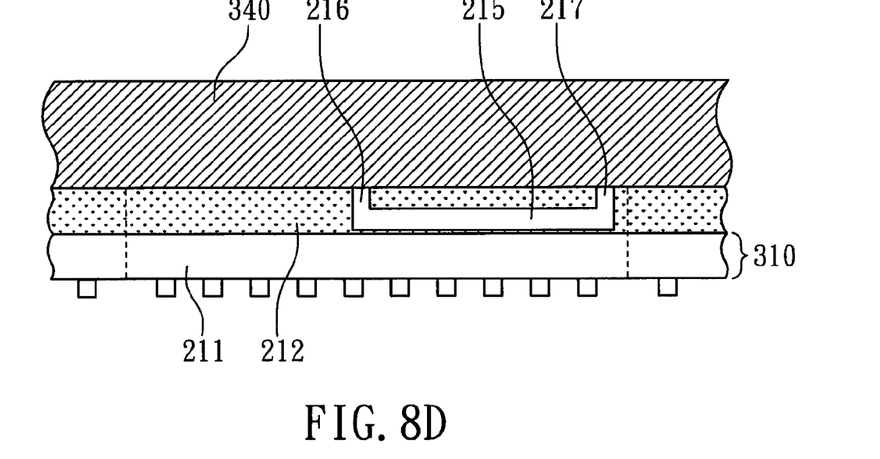

The fabrication processes of embedding the redistribution layer 215 into the organic layer 212 are further described in detail. In a preferred embodiment, the previous described process step of forming the redistribution layer 215 further comprises the following detail step. As shown in FIG. 8A, in the step of forming the organic layer, where the organic layer 212 is preformed under a metal foil 320 such as Copper Clad Laminate (CCL) and is laminated to the lapped back surface 311A of the wafer 310. That is to say, the metal foil 320 is provided over the organic layer 212. Then, in a preferable embodiment, as shown in FIG. 8B, before the formation of the redistribution layer 215, half-etching technology is implemented in advance to pattern the upper layer of the metal foil 320 to form the first terminals 216 and the second terminals 217. Then, as shown in FIG. 8C, second pattern etching is proceeded to etch the remaining bottom layer of the metal foil 320 to become the redistribution layer 215. Then, as shown in FIG. 8D, by implementation of thermally mold compression, the organic layer 211 is heated to become fluid and a pressure plate 340 is exerted on the first terminals 216, the second terminals 217, and the redistribution layer 215 with appropriate temperature and pressure to embed the redistribution layer 215 into the organic layer 211.

Figure 9A:
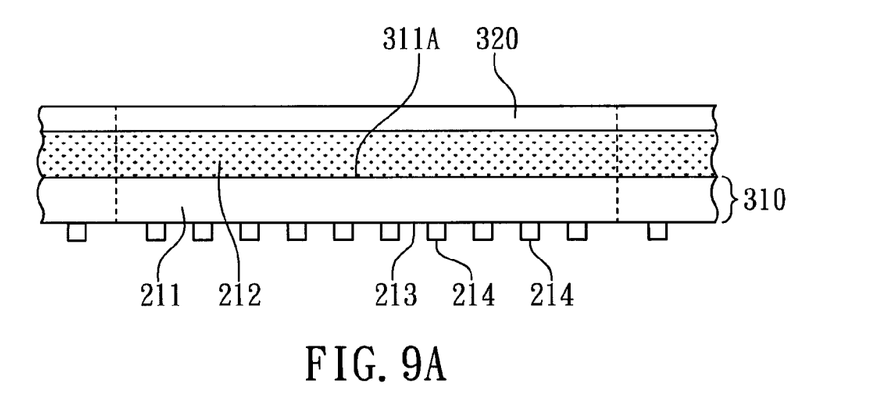
FIGS. 9A to 9D are the cross-sectional views of components of the semiconductor package in the fabricating sub-step of "forming a redistribution layer" in the step of "providing a mother chip" to illustrate its sub-steps according to another preferred embodiment of the present invention.
Figure 9B:
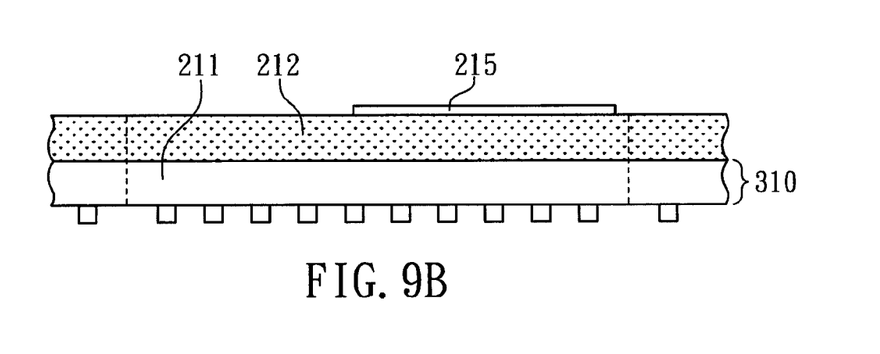
Figure 9C:
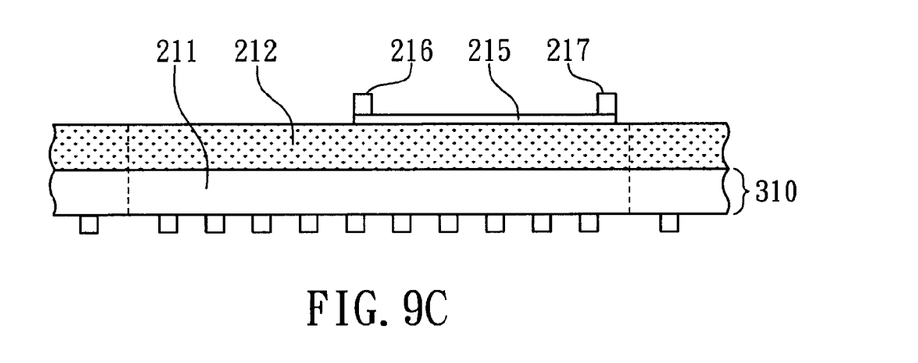
Figure 9D:
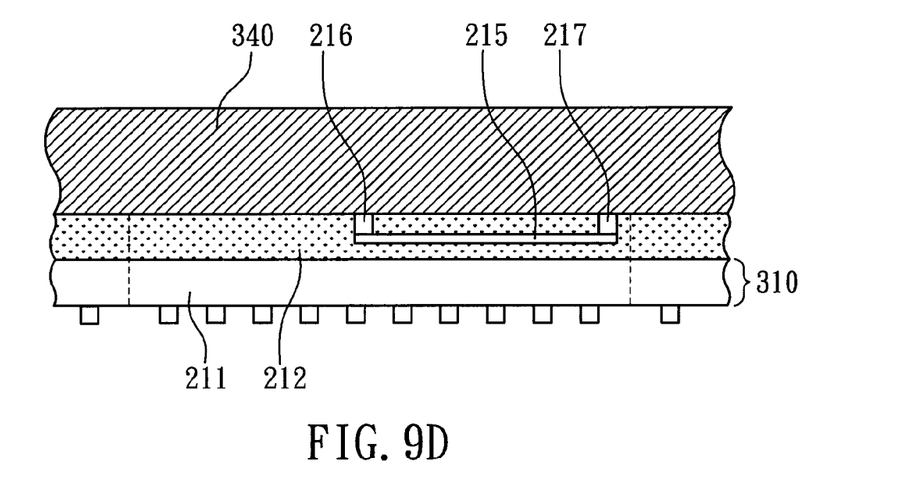

However, the present invention is not limited to the previous described embedding method of the redistribution layer. Another preferred embodiment is disclosed as below. As shown in FIG. 9A, in the step of "forming the organic layer", the organic layer 212 is preformed under a metal foil 320 which is thinner than the thickness of the organic layer 212. The combination of the metal foil 320 and the organic layer 212 is laminated to the lapped back surface 311A of the wafer 310. Then, as shown in FIG. 9B, the metal foil 320 is selectively etched to form the redistribution layer 215 by exposure and development of photoresist. Then, as shown in FIG. 9C, after formation of the redistribution layer 215, the first terminals 216 and the second terminals 217 are disposed on the redistribution layer 215 by plating or other terminal formation technology. Then, as shown in FIG. 9D, by implementation of thermally mold compression, a pressure plate 340 is exerted on the first terminals 216, the second terminals 217, and the redistribution layer 215 with appropriate temperature and pressure to embed the redistribution layer 215 into the organic layer 211.

Figure 10:
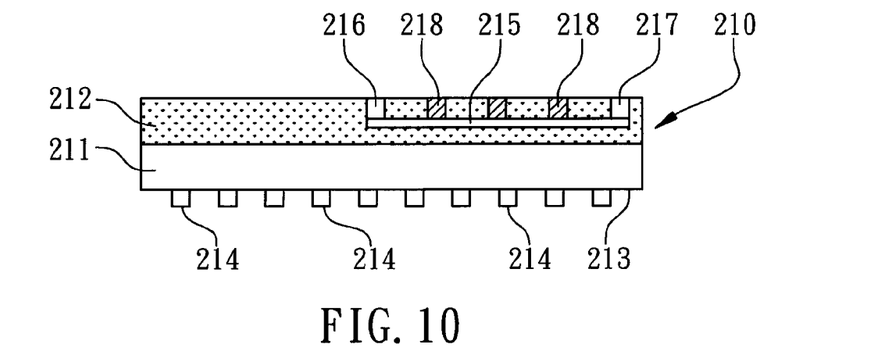
FIG. 10 is a cross-sectional view of a mother chip of a semiconductor package according to another preferred embodiment of the present invention.

Another preferred embodiment, another mother chip for the semiconductor packaging method of multi-chip stack is revealed which is similar to the previous described mother chip 210, therefore, the same described components and numbers are followed. As shown in FIG. 10, a plurality of pressure blocks 218 are disposed on the redistribution layer 215 and between the first terminals 216 and the second terminals 217. The redistribution layer 215 can be completely embedded into the organic layer 215 by pressing the first terminals 216, the second terminals 217 and the pressure blocks 218.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A semiconductor packaging method without an interposer, comprising:
    providing a mother chip being a two-layer structure consisting of a semiconductor layer and an organic layer, wherein a plurality of electrodes are disposed on a first active surface of the semiconductor layer and a redistribution layer is embedded in the organic layer with a plurality of first terminals and a plurality of second terminals disposed on the redistribution layer and exposed from the organic layer;
    mounting the mother chip on a substrate to electrically connect the electrodes of the mother chip to the substrate;
    attaching a daughter chip onto the mother chip, wherein a second active surface of the daughter chip is in contact with the organic layer with a plurality of bonding pads of the daughter chip bonded to the first terminals; and
    disposing a plurality of electrically connecting components to electrically connect the second terminals to the substrate.

2. The method as claimed in claim 1, wherein the organic layer is a die attach film with adhesion.

3. The method as claimed in claim 1, wherein the semiconductor layer has a lapped back surface.

4. The method as claimed in claim 1, wherein the organic layer further includes a plurality of pressure blocks on the redistribution layer, wherein the pressure blocks are disposed between the first terminals and the second terminals for completely embedding the redistribution layer into the organic layer.

5. The method as claimed in claim 1, wherein the redistribution layer is electrically isolated from the semiconductor layer.

6. The method as claimed in claim 1, wherein the daughter chip is a bare chip with the second active surface completely attached to the organic layer.

7. The method as claimed in claim 1, wherein the electrically connecting components include a plurality of bonding wires having a loop height not higher than the daughter chip.

8. The method as claimed in claim 1, further comprising the step of forming an encapsulant on the substrate to encapsulate the mother chip, the daughter chip, and the electrically connecting components.

9. The method as claimed in claim 1, wherein the step of providing the mother chip includes:
    providing a wafer;
    lapping a back surface of the wafer to achieve the thickness of the semiconductor layer;
    forming an organic layer over the lapped back surface of the wafer;
    forming a redistribution layer embedded into the organic layer; and
    sawing the lapped wafer and the organic layer to form the mother chip.

10. The method as claimed in claim 3, wherein the thickness of the organic layer is smaller than half of the thickness of the semiconductor layer.

11. The method as claimed in claim 8, wherein the electrodes are a plurality of metal pillars extruded from the first active surface to allow the encapsulant to fill into the gap between the mother chip and the substrate.

12. The method as claimed in claim 8, further comprising the step of disposing a plurality of external terminals on a bottom surface of the substrate.

13. The method as claimed in claim 9, wherein the step of forming the organic layer includes the step of providing a metal foil over the organic layer, and the step of forming the redistribution layer includes:
    patterning the metal foil by etching to form the redistribution layer; and
    thermally compressing the redistribution layer to be embedded into the organic layer.

14. The method as claimed in claim 13, wherein the step of forming the redistribution layer further includes the step of pre-etching the metal foil to form the first terminals and the second terminals before patterning the metal foil.

15. The method as claimed in claim 13, wherein the step of forming the redistribution layer further includes the step of disposing the first terminals and the second terminals on the redistribution layer after patterning the metal foil and before thermally compressing the redistribution layer.

* * * * *